United States Patent
Hong

(10) Patent No.: US 10,344,376 B2
(45) Date of Patent: Jul. 9, 2019

(54) MASK FRAME ASSEMBLY FOR THIN FILM DEPOSITION AND METHOD OF MANUFACTURING THE SAME

(75) Inventor: Jeremy Hong, Yongin (KR)

(73) Assignee: Samsung Display Co., Ltd., Yonging-si (KR)

( * ) Notice: Subject to any disclaimer, the term of this patent is extended or adjusted under 35 U.S.C. 154(b) by 1105 days.

(21) Appl. No.: 13/240,818

(22) Filed: Sep. 22, 2011

(65) Prior Publication Data

US 2012/0279444 A1    Nov. 8, 2012

(30) Foreign Application Priority Data

May 6, 2011 (KR) .................. 10-2011-0043073

(51) Int. Cl.
*C23C 14/04* (2006.01)
*C23C 16/04* (2006.01)

(52) U.S. Cl.
CPC .......... *C23C 16/042* (2013.01); *C23C 14/042* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 4,806,820 A * | 2/1989 | Berner et al. | 313/404 |
| 6,615,962 B2 * | 9/2003 | Back et al. | 192/3.28 |
| 2001/0054864 A1 * | 12/2001 | Hens et al. | 313/407 |
| 2003/0101932 A1 * | 6/2003 | Kang | 118/504 |
| 2006/0011137 A1 * | 1/2006 | Keller | C23C 16/042 118/720 |
| 2010/0192856 A1 | 8/2010 | Sung et al. | |
| 2011/0139069 A1 | 6/2011 | Ahn et al. | |

FOREIGN PATENT DOCUMENTS

| | | |
|---|---|---|
| JP | 2006124761 A | 5/2006 |
| KR | 10-2009-0003014 | 1/2009 |
| KR | 10-2010-0000129 | 1/2010 |
| KR | 10-2010-0090070 | 8/2010 |
| KR | 10-2010-0101919 | 9/2010 |
| KR | 101030030 B1 | 4/2011 |

OTHER PUBLICATIONS

Japanese Office Action issued by Japanese Patent Office dated Jun. 30, 2015 in corresponding Japanese Patent Application No. 2011-263515 and Request for Entry of the Accompanying Office Action attached herewith.

A Granted Documents issued by the Chinese Intellectual Property Office on Dec. 14, 2016 for the Chinese Patent No. 201210005289.7, which corresponds to above-referenced U.S. Application and a Request for Entry of the Accompanying Granted Documents attached herewith.

* cited by examiner

*Primary Examiner* — Charles Capozzi
(74) *Attorney, Agent, or Firm* — H.C. Park & Associates, PLC

(57) ABSTRACT

A mask frame assembly may be constructed with a supporting bar and a plurality of stick-type split masks installed on a frame while crossing each other. The supporting bar and the split masks are fixed to each other by being welded to each other at points where the supporting bar and the plurality of split masks cross, and a partial cutting portion is formed around each of the welding points by cutting portions of the split masks. By using the supporting bar, the split masks are prevented from drooping, and adhesion between the split masks and a substrate is enhanced.

12 Claims, 6 Drawing Sheets

MASK FRAME ASSEMBLY FOR THIN FILM DEPOSITION AND METHOD OF MANUFACTURING THE SAME

CLAIM OF PRIORITY

This application makes reference to, incorporates the same herein, and claims all benefits accruing under 35 U.S.C. § 119 from an application earlier filed in the Korean Intellectual Property Office on May 6, 2011 and there duly assigned Serial No. 10-2011-0043073.

BACKGROUND OF THE INVENTION

Field of the Invention

The present invention relates to mask frame assemblies for thin film deposition, and more particularly, to mask frame assemblies using a split mask, and methods of manufacturing the mask frame assemblies.

Description of the Related Art

In general, among display devices, organic light-emitting display devices have a wide viewing angle, excellent contrast, and a high response speed.

The organic light-emitting display devices have a stacked structure in which an emissive layer is inserted between an anode and a cathode and realizes colors based on the principle that light is emitted as holes and electrons which are injected from the anode and the cathode into the emissive layer, and which recombine. However, it is difficult to obtain high light emission efficiency with the above structure, and thus other intermediate layers, such as an electron injection layer, an electron transport layer, a hole transport layer, and a hole injection layer, are selectively interposed between the electrodes and the emissive layer.

The electrodes and the intermediate layers, including the emissive layer, may be formed using various methods, and one of the methods is deposition. In order to manufacture organic light-emitting display devices using a deposition method, a fine metal mask (FMM) having the same pattern as a pattern of a thin film to be formed is aligned on a substrate, and a raw material of the thin film is deposited so as to form the thin film having the desired pattern.

However, if the FMM is formed so as to have a large surface area in order to correspond to a large-sized display device, drooping of a center portion of the FMM due to its weight becomes great, and accordingly a split mask in which a plurality of mask sticks are attached is parallel with one another is preferred.

However, the split mask is also thin, and thus it may droop to some extent, although not as much as a large-size mask. Accordingly, the split mask may not be closely adhered to a substrate in a deposition operation, and this is likely to cause deposition defects. In order to solve this problem, a structure is used in which structure a supporting bar is installed on a frame in a direction perpendicular to a direction in which the split mask is arranged on the frame, in which two end portions of the split mask are welded to the frame, and in which a portion of a center portion between the two end portions which crosses the supporting bar is welded to the supporting bar to prevent drooping. That is, as the center portion might droop when only the two end portions of the split mask are fixed to the frame, the center portion is fixed to the supporting bar by welding, thereby preventing drooping of the split mask.

However, although drooping may be prevented by installing the supporting bar so as to fix the split mask, when the split mask is to be adhered to a substrate in order to perform a deposition operation, a portion of the split mask around a point where the split mask is welded to the supporting bar may not easily adhere to the substrate. That is, in a deposition operation, a mask frame assembly including the split mask is disposed on a substrate (or a substrate is disposed on the mask frame assembly) and the split mask is pulled toward the substrate by a magnetic force from the substrate so as to thereby completely adhere the split mask to the substrate. However, since the portion welded to the supporting bar is fixed, the portion around the welding point is not closely adhered to the substrate. In summary, if the supporting bar is not installed, drooping of the split mask due to its weight is great and the split mask may not be closely adhered to the substrate during a deposition operation. If the supporting bar is installed and the center portion of the split mask is fixed by welding, drooping of the split mask is prevented but the portion around the welding point is not closely adhered to the substrate.

Thus, a method for solving this problem is required.

SUMMARY OF THE INVENTION

One or more embodiments of the present invention provide mask frame assemblies for thin film deposition and a method of manufacturing the same, in which a supporting bar is used to prevent drooping of a split mask and the split mask and a substrate are easily closely adhered to each other.

According to an aspect of the present invention, a mask frame assembly for thin film deposition may include a frame having an opening portion; a supporting bar installed on the frame across the opening portion; and a plurality of split masks which are installed on the frame across the opening portion so as to cross the supporting bar; wherein two end portions of the plurality of split masks are fixed to the frame, and the plurality of split masks are fixed to the supporting bar at points where the plurality of split masks and the supporting bar cross; and wherein a partial cutting portion is formed around each of the points where the plurality of split masks are fixed to the supporting bar by cutting portions of the plurality of split masks.

A plurality of deposition patterns may be formed in the plurality of split masks, and the split masks and the supporting bar may cross each other at points between the plurality of deposition patterns.

A plurality of the supporting bars may be installed in parallel with each other on the frame.

The split masks and the supporting bar may be fixed to each other by forming a welding point at each of the points where the split masks and the supporting bar cross by spot welding, and a pair of the partial cutting portions may be formed symmetrically with respect to the welding point.

The pair of partial cutting portions may be cut parallel to each other toward an inner portion from an outer portion of the split masks.

The pair of partial cutting portions may be cut so that the pair converges into an inner portion from an outer portion of the split masks.

The pair of partial cutting portions may be cut so that the pair diverges toward an inner portion from an outer portion of the split masks.

The split masks and the supporting bar may be fixed to each other by forming a welding point at each of the points where the split masks and the supporting bar cross by spot welding, and the partial cutting portion may have a U-shape which surrounds the welding point.

According to another aspect of the present invention, a method of manufacturing a mask frame assembly for thin film deposition may include the steps of: preparing a frame on which a supporting bar is installed across an opening portion of the frame; preparing a plurality of split masks which are installed on the frame while crossing the supporting bar, wherein a partial cutting portion is formed around each of points where the plurality of split masks and the supporting bar are to cross by cutting portions of the plurality of split masks; and fixing two end portions of the split masks to the frame and the split masks to the supporting bar at the points where the plurality of split masks and the supporting bar cross.

A plurality of deposition patterns may be formed in the split masks, and the split masks and the supporting bar may be installed while crossing each other at points between the plurality of deposition patterns.

A plurality of supporting bars may be installed in parallel with each other on the frame.

The split masks and the supporting bar may be fixed to each other by forming a welding point at each of the points where the split masks and the supporting bar cross by spot welding, and a pair of the partial cutting portions may be formed symmetrically with respect to the welding point.

The pair of partial cutting portions may be cut parallel with each other toward an inner portion from an outer portion of the split masks.

The pair of partial cutting portions may be cut so that the pair converges into an inner portion from an outer portion of the split masks.

The pair of partial cutting portions may be cut so that the pair diverges toward an inner portion from an outer portion of the split masks.

The split masks and the supporting bar may be fixed to each other by forming a welding point at each of the points where the split masks and the supporting bar cross by spot welding, and the partial cutting portion may have a U-shape which surrounds the welding point.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
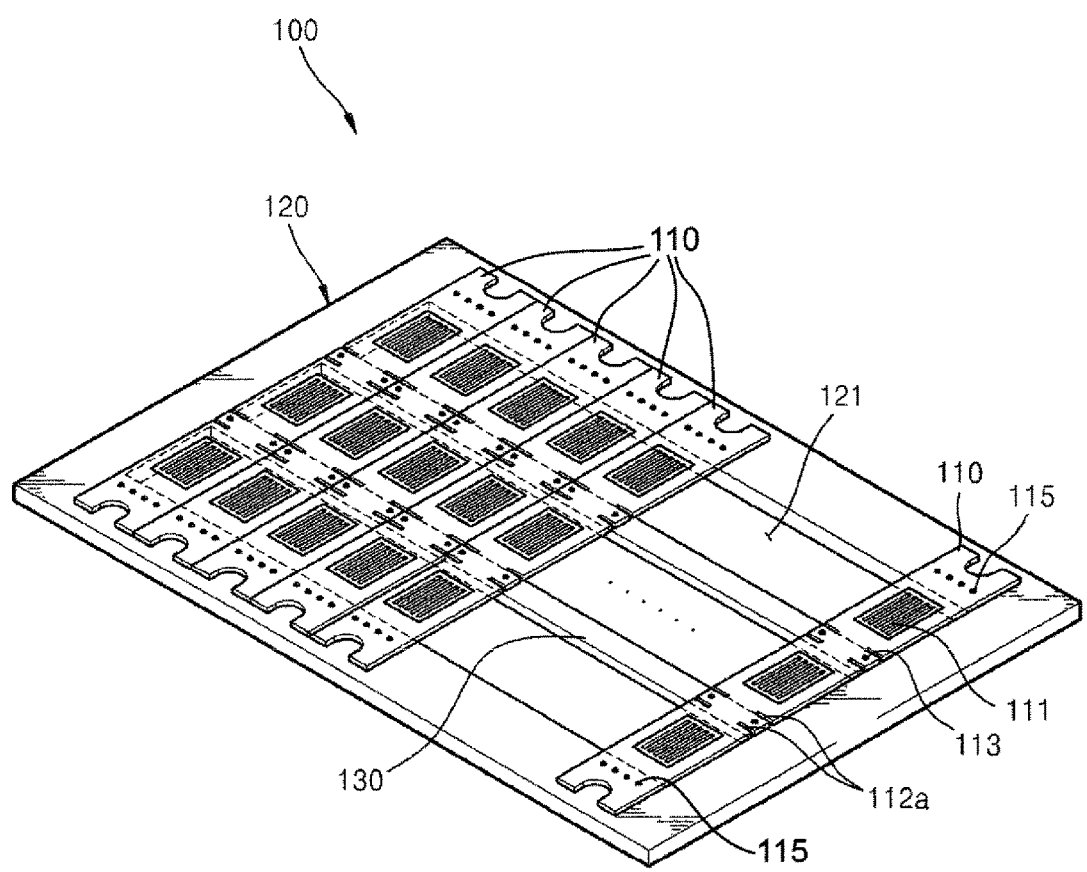
FIG. 1 is a disassembled perspective view of a mask frame assembly according to an embodiment of the present invention.
Figure 2:
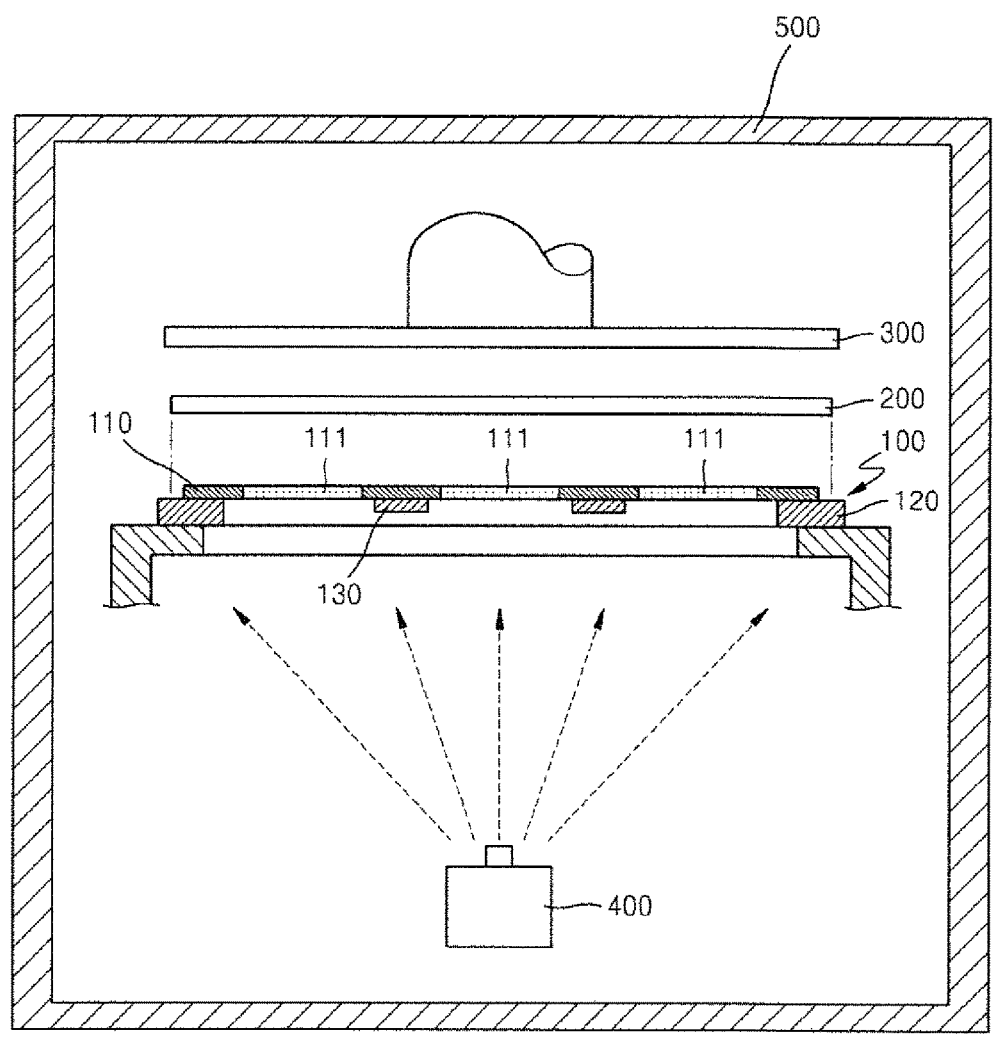
FIG. 2 is a schematic view illustrating a deposition operation using the mask frame assembly illustrated in FIG. 1.

FIG. 1 is a disassembled perspective view of a mask frame assembly according to an embodiment of the present invention; and FIG. 2 is a schematic view illustrating a deposition operation using the mask frame assembly illustrated in FIG. 1. More specifically, FIG. 2 is a schematic view illustrating the deposition operation performed after installing the mask frame assembly in a deposition chamber.

First, as illustrated in FIG. 1, the mask frame assembly 100 includes a frame 120 having an opening portion 121 and a plurality of split masks 110 having two end portions fixed to the frame 120. In FIG. 1, only a few of the split masks 110 are illustrated to show the opening portion 121 for convenience of description, but when manufacturing of the mask frame assembly 100 is completed, the opening portion 121 is completely filled with the split masks 110.

The frame 120 forms an outline of the mask frame assembly 100 having a rectangular shape with the opening portion 121 centered in the mask frame assembly 100. The two end portions of the split masks 110 are fixed to a pair of opposite sides of the frame 120 by spot welding. Welding points 115 of the two end portions are also shown.

Also, a plurality of supporting bars 130 are installed on the frame 120 so as to cross the opening portion 121 perpendicularly relative to the split masks 110. The supporting bars 130 ensure that the split masks 110 do not droop, and the split masks 110 and the supporting bars 130 are fixed to each other by spot welding at points where the split masks 110 and the supporting bars 130 cross.

The split masks 110 are long stick-shaped members and include a plurality of deposition patterns 111 located within the opening portion 121, and the two end portions of the split masks 110 are fixed to the frame 120 by spot welding at welding points 115, similar to welding points 113 where the split masks 110 and the supporting bars 130 cross each other. The split masks 110 may be formed of, for example, nickel, a nickel alloy, a nickel-cobalt alloy, etc. The welding points 113 where the split masks 110 and the supporting bars 130 cross are located between the plurality of deposition patterns 111. That is, the supporting bars 130 cross the split masks 110 while avoiding portions corresponding to the deposition patterns 111, and the supporting bars 130 and the split masks 110 are combined with each other by forming the welding points 113 at the points where the split masks 110 and the supporting bars 130 cross. Accordingly, in such a crossing structure, the supporting bars 130 do not interfere with the deposition patterns 111.

Referring to FIG. 2, by installing the mask frame assembly 100 having the above-described structure within the deposition chamber 500 and performing the deposition operation, a desired pattern may be obtained as deposition material generated from a deposition source 400 is deposited on a substrate 200 through the deposition patterns 111 formed in the split masks 110.

A magnet 300, which exerts a magnetic force so as to adhere the split masks 110 of the mask frame assembly 100 to the substrate 200, is also included.

Figure 3:
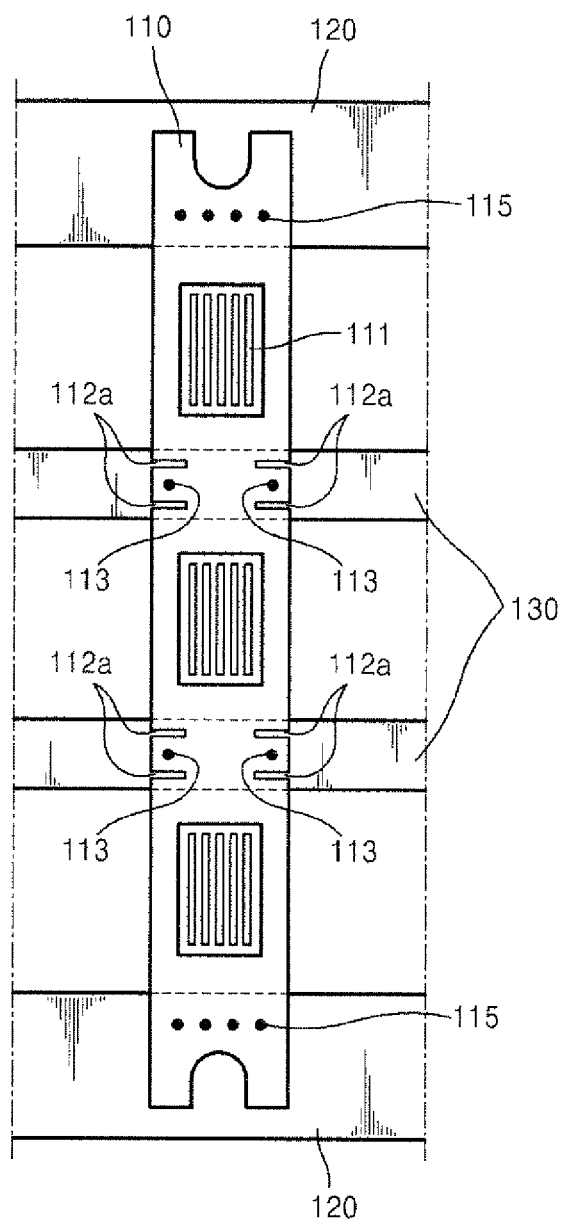
FIG. 3 is a plan view illustrating the structure of a split mask of the mask frame assembly illustrated in FIG. 1.

FIG. 3 is a plan view illustrating the structure of a split mask of the mask frame assembly illustrated in FIG. 1.

In FIG. 3, partial cutting portions 112a are formed as portions of bodies of the split masks 110, and are cut and formed around the welding points 113 at each of the points where the supporting bars 130 and the split masks 110 cross. That is, as illustrated in FIGS. 1 and 3, a pair of the partial cutting portions 112a are formed symmetrically around each of the welding points 113, which combine the supporting bars 130 with the split masks 110. In other words, portions of the bodies of the split masks 110 around the welding points 113 are cut a little bit from an outer portion toward an inner portion.

This enhances adhesive power when the magnet 300 of FIG. 2 pulls the split masks 110 so as to adhere the split masks 110 to the substrate 200 using magnetic power. That is, as described above, when the supporting bars 130 and the split masks 110 are fixed, drooping of the split masks 110 may be prevented. However, when the magnet 300 pulls the split masks 110 toward the substrate 200, since portions of the split masks 110 around the welding points 113 are fixed to the supporting bars 130 by spot welding, the portions are not easily pulled, and end portions of the deposition patterns 111 near the welding points 113 may not be adhered to the substrate 200. If a deposition operation is performed in this state, deposition quality corresponding to the end portions of the deposition patterns 111 is degraded, and products having such degraded quality may have flame defects, that is, flame-shaped abnormal light emission from corresponding parts.

However, if the partial cutting portions 112*a* are formed, as in the current embodiment of the present invention, a binding force which fixes the portions of the split masks 110 around the welding points 113 becomes weak, that is, portions of the split masks 110 near the deposition patterns 111 are separated from the welding points 113 via the partial cutting portions 112*a* to some extent, and thus the split masks 110 are easily pulled toward the substrate 200 by a magnetic force of the magnet 300. Accordingly, the portions of the split masks 110 around the deposition patterns 111 are firmly adhered to the substrate 200 up to the end portions of the deposition patterns 111 near the welding points 113, and thus stable deposition quality may be provided.

Referring to FIGS. 1 thru 3, the mask frame assembly 100 may be manufactured as follows.

First, the frame 120 on which the supporting bars 130 are installed, and the split masks 110 in which the deposition patterns 111 and the partial cutting portions 112*a* are formed, are prepared. The partial cutting portions 112*a* are formed symmetrically and in advance on two sides of positions where the welding points 113 are expected to be formed by considering positions where the split masks 110 are to be welded to the supporting bars 130.

Then, the split masks 110 are sequentially fixed to the frame 120. The two end portions of the split masks 110 are fixed to the frame 120 by spot welding, and the split masks 110 are also fixed to the supporting bars 130 by spot welding at the points where the split masks 110 and the supporting bars 130 cross. In this regard, the welding points 113 formed at the points where the split masks 110 and the supporting bars 130 cross are located between pairs of the partial cutting portions 112*a*, which are formed in advance.

Consequently, as described above, drooping of the split masks 110 is prevented by using the supporting bars 130, and the mask frame assembly 100, including the split masks 110 which are better adhered to the substrate 200, may be manufactured.

Also, it is ensured that a coupling force between the supporting bars 130 and the split masks 110 may be enhanced when necessary. If the partial cutting portions 112*a* are not formed, even when it is desired to increase the number of welding points 113 for more stable coupling between the supporting bars 130 and the split masks 110, it is not possible to increase the number of the welding points 113 because there is a possibility that adhesion between the split masks 110 and the substrate 200 may be degraded. However, according to the current embodiment of the present invention, when the adhesion between the split masks 110 and the substrate 200 is improved significantly by forming the partial cutting portions 112*a*, the coupling force between the supporting bars 130 and the split masks 110 increases so as to become sufficient, and a more stable and rigid structure is implemented.

Also, the mask frame assembly 100 for thin film deposition may be used in various thin film deposition operations, which include an operation of patterning an organic emissive layer.

Meanwhile, according to the current embodiment of the present invention, a pair of the partial cutting portions 112*a* are formed in parallel with each other, but they may also be provided in different forms.

Figure 4A:
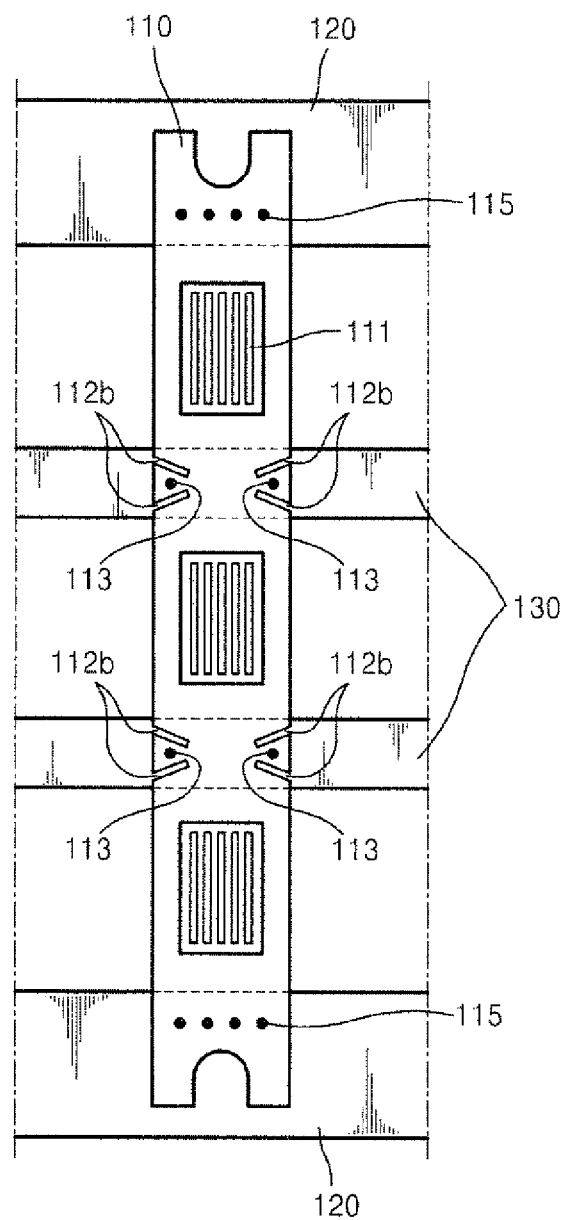
FIGS. 4A thru 4C illustrate a modifiable structure of the split mask illustrated in FIG. 3.
Figure 4B:
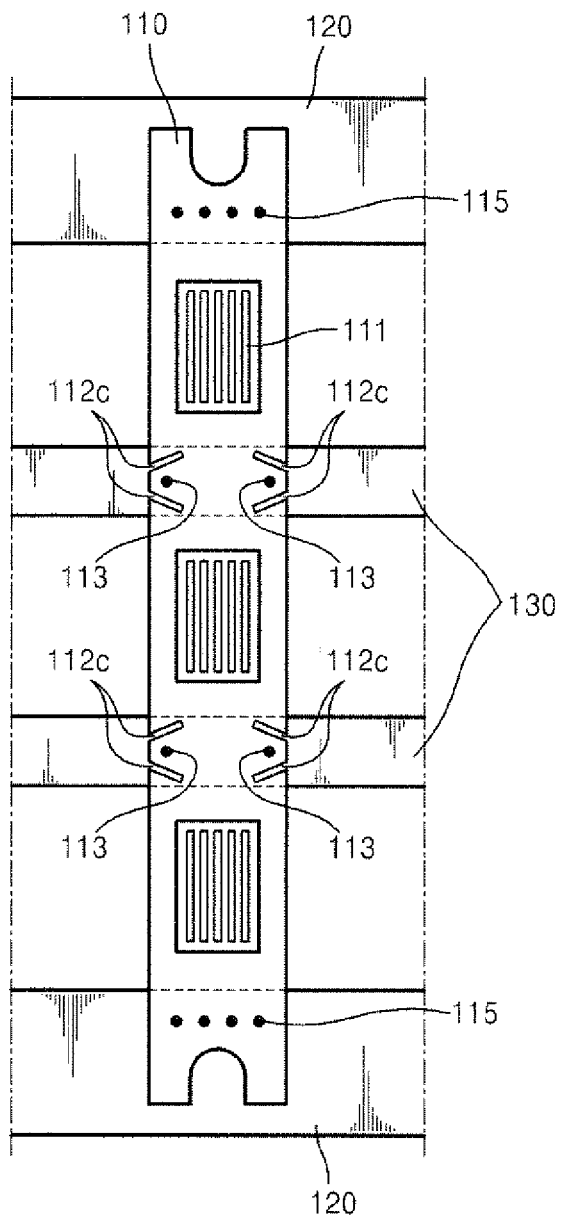
Figure 4C:
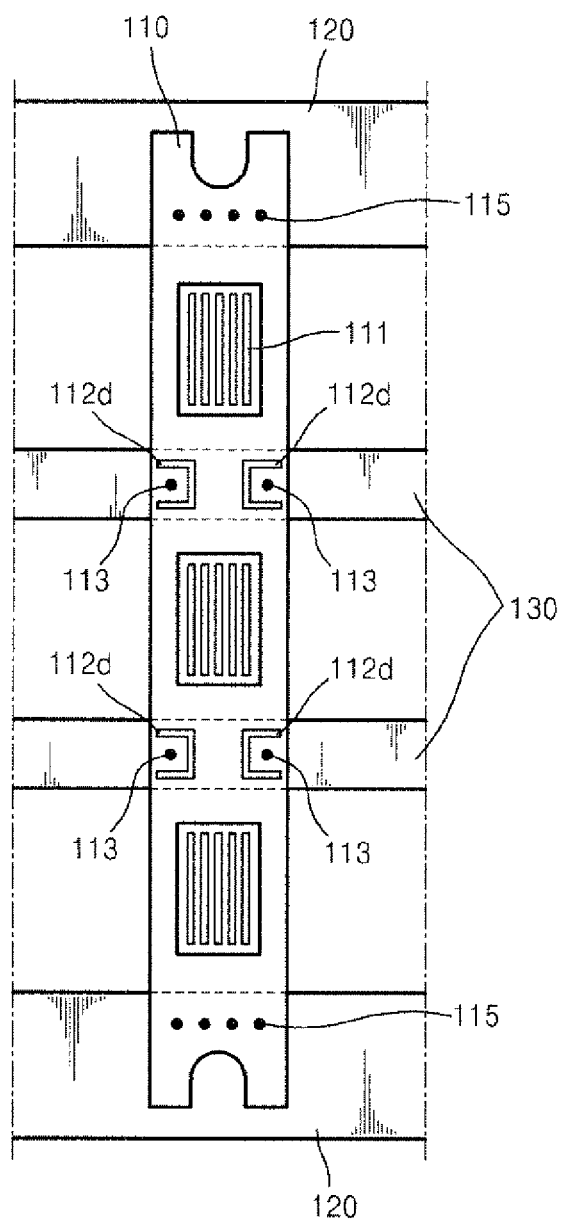

FIGS. 4A thru 4C illustrate a modifiable structure of the split mask illustrated in FIG. 3.

For example, as illustrated in FIG. 4A, a pair of partial cutting portions 112*b* may be formed so as to converge toward an inner portion from an outer portion of the bodies of the split masks 110. Conversely, a pair of partial cutting portions 112*c* which diverge may be formed, as illustrated in FIG. 4B.

In addition, partial cutting portions 112*d* having a U-shape surrounding the welding points 113 may also be formed, as illustrated in FIG. 4C.

That is, as long as the partial cutting portions attenuate a binding force between the split masks 110 and the supporting bars 130 so as to easily adhere portions of the deposition patterns 111 to the substrate 200, the partial cutting portions may also have other various forms.

As described above, according to the mask frame assemblies for thin film deposition and the method of manufacturing the same according to the embodiments of the present invention, the split mask and a substrate may be closely adhered to each other during a deposition operation, and thus deposition defects may be effectively prevented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A thin film deposition apparatus for depositing a patterned thin film on a substrate, the deposition apparatus comprising:
   a deposition chamber;
   a deposition source arranged within and at a bottom of the deposition chamber;
   a mask frame assembly arranged within the deposition chamber and interposed between the deposition source and the substrate; and
   a magnet arranged on an opposite side of the substrate from the mask frame assembly to pull the mask frame assembly towards the substrate, the mask frame assembly comprising:
      a frame having an opening portion;
      a supporting bar installed on the frame and across the opening portion; and
      a plurality of split masks installed on the frame across the opening portion so as to cross the supporting bar;
      each of the split masks having two opposing end portions that are welded to the frame at first welding points, each of said split masks also being welded to the supporting bar at second welding points where said each split mask and the supporting bar cross each other;

wherein cut-out portions are formed in said each split mask around each of said second welding points where said each split mask is welded to the supporting bar, the cut-out portions to allow for a close adherence of the split masks to the substrate by the magnet in a vicinity of the second welding points; and wherein the cut-out portions being formed in pairs about each of said second welding points, each pair of cut-out portions converging toward an inner portion from an outer portion of said each split mask.

2. The thin film deposition apparatus of claim 1, a plurality of deposition patterns being formed in each of the plurality of split masks; and the split masks and the supporting bar crossing each other at points between neighboring ones of the plurality of deposition patterns, the neighboring ones of the deposition patterns being in a vicinity of each second welding point and being closely adhered to the substrate due to the cut-out portions.

3. The thin film deposition apparatus of claim 1, wherein a plurality of supporting bars are installed in parallel with each other on the frame.

4. A mask frame assembly to deposit a patterned thin film onto a substrate, comprising:
 a frame having an opening portion;
 a supporting bar installed on the frame and across the opening portion; and
 a plurality of split masks installed on the frame across the opening portion so as to cross the supporting bar;
 two end portions of each split mask being fixed to the frame and said each split mask being fixed to the supporting bar by welds at welding points where said each split mask and the supporting bar cross each other;
 a pair of cut-out portions being formed in said each split mask around each of said welding points;
 the pair of cut-out portions being formed in said each split mask symmetrically with respect to each of the welding points; and
 the pair of cut-out portions diverging toward an inner portion from an outer portion of said each split mask, wherein when the mask frame assembly is arranged on an opposite side of the substrate from a magnet, the cut-out portions to allow portions of the split masks in a vicinity of the welding points to adhere to the substrate.

5. The mask frame assembly of claim 4, a plurality of deposition patterns being formed in the plurality of split masks; and the split masks and the supporting bar crossing each other at locations between and in a vicinity of the plurality of deposition patterns, the cut-out portions allow the deposition patterns of the split masks in the vicinity of the welding points to adhere to the substrate.

6. The mask frame assembly of claim 4, wherein a plurality of supporting bars are installed in parallel with each other on the frame.

7. A thin film deposition apparatus to deposit a patterned thin film on a substrate, the deposition apparatus comprising:
 a deposition chamber;
 a deposition source arranged within and at a bottom of the deposition chamber;
 a mask frame assembly arranged within the deposition chamber and interposed between the deposition source and the substrate; and a magnet arranged on an opposite side of the substrate from the mask frame assembly to pull the mask frame assembly towards the substrate, the mask frame assembly comprising:
 a frame having an opening portion;
 a supporting bar installed on the frame and across the opening portion; and
 a plurality of split masks installed on the frame across the opening portion so as to cross the supporting bar;
 each of the split masks having two opposing end portions that are welded to the frame at first welding points, each of said split masks also being welded to the supporting bar at second welding points where said each split mask and the supporting bar cross each other;
 wherein cut-out portions are formed in said each split mask around each said second welding points where said each split mask is welded to the supporting bar, the cut-out portions to allow for a close adherence of the split masks to the substrate in a vicinity of the second welding points; and
 wherein the cut-out portions being formed in pairs about each second welding point, each pair of cut-out portions being cut in parallel with each other and extending in parallel with each other toward an inner portion from an outer portion of said each split mask.

8. A mask frame assembly for thin film deposition onto a substrate, comprising:
 a frame having an opening portion;
 a supporting bar installed on the frame and across the opening portion; and
 a plurality of split masks installed on the frame across the opening portion so as to cross the supporting bar;
 two end portions of each split mask being fixed to the frame and said each split mask being fixed to the supporting bar by welds at welding points where said each split mask and the supporting bar cross each other;
 a cut-out portion being arranged in said each split mask around each of said welding points where said each split mask is fixed to the supporting bar; and
 the cut-out portion having a U-shape which surrounds the welding point, wherein when the mask frame assembly is arranged on an opposite side of the substrate from a magnet, the cut-out portion to allow the split mask to adhere to the substrate by a force of the magnet at a location corresponding to a vicinity of the welding point where the split mask is attached to the supporting bar.

9. The thin film deposition apparatus of claim 7, a plurality of deposition patterns being formed in each of the plurality of split masks; and the split masks and the supporting bar crossing each other at points between neighboring ones of the plurality of deposition patterns, the neighboring ones of the deposition patterns being in a vicinity of each second welding point and being closely adhered to the substrate due to the cut-out portions.

10. The thin film deposition apparatus of claim 7, a plurality of supporting bars are installed in parallel with each other on the frame.

11. The mask frame assembly of claim 8, a plurality of deposition patterns being arranged in each of the plurality of split masks; and the split masks and the supporting bar crossing each other at locations between and in a vicinity of neighboring ones of the plurality of deposition patterns, the cut-out portion to allow the deposition patterns of the split mask in the vicinity of the welding point to adhere to the substrate.

12. The mask frame assembly of claim 8, wherein a plurality of supporting bars are installed in parallel with each other on the frame.

* * * * *